United States Patent
Hwang et al.

(10) Patent No.: US 12,027,371 B2
(45) Date of Patent: Jul. 2, 2024

(54) SUBSTRATE PROCESSING METHOD

(71) Applicant: WONIK IPS CO., LTD., Pyeongtaek-si (KR)

(72) Inventors: Ah Young Hwang, Pyeongtaek-si (KR); Won Jun Jang, Seoul (KR); Joo Suop Kim, Hwaseong-si (KR); Kyung Park, Seoul (KR); Sang Rok Nam, Suwon-si (KR); Hae Jin Ahn, Hwaseong-si (KR); Dae Seong Lee, Dongducheon-si (KR); Chang Hun Kim, Osan-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 435 days.

(21) Appl. No.: 17/550,510

(22) Filed: Dec. 14, 2021

(65) Prior Publication Data
US 2022/0319853 A1 Oct. 6, 2022

(30) Foreign Application Priority Data
Apr. 2, 2021 (KR) .................... 10-2021-0043412

(51) Int. Cl.
*H01L 21/223* (2006.01)
*C23C 14/58* (2006.01)
(Continued)

(52) U.S. Cl.
CPC ........ *H01L 21/223* (2013.01); *C23C 14/5806* (2013.01); *C23C 16/56* (2013.01); *H01L 21/2251* (2013.01); *H01L 21/321* (2013.01)

(58) Field of Classification Search
None
See application file for complete search history.

(56) References Cited

U.S. PATENT DOCUMENTS

| 7,084,076 B2 * | 8/2006 | Park | C23C 16/45534 |
| | | | 257/E21.279 |
| 7,189,661 B2 * | 3/2007 | You | H01L 21/0234 |
| | | | 257/E21.268 |

(Continued)

FOREIGN PATENT DOCUMENTS

JP   2011176028 A   9/2011
JP   2017045982 A   3/2017

*Primary Examiner* — Khaja Ahmad
(74) *Attorney, Agent, or Firm* — WILLIAM PARK & ASSOCIATES LTD.

(57) ABSTRACT

Disclosed is a substrate processing method including: a pressurizing operation of raising a process pressure from a first pressure ($P_1$) to a second pressure ($P_2$) that is greater than the atmospheric pressure; a depressurizing operation of lowering the process pressure from a sixth pressure ($P_6$), which is greater than the atmospheric pressure, to a seventh pressure ($P_7$); and an annealing operation of changing the process pressure into a preset pressure change pattern between the pressurizing operation and the depressurizing operation, under a temperature atmosphere of a second temperature ($T_2$) higher than the room temperature. A temperature raising operation of raising a temperature atmosphere from a first temperature ($T_1$) to the second temperature ($T_2$) is performed from a preset temperature raising start point ($t_1$) to a preset temperature raising end point ($t_2$) while the pressurizing operation is performed or after the pressurizing operation is performed.

15 Claims, 6 Drawing Sheets

(51) Int. Cl.
    *C23C 16/56*     (2006.01)
    *H01L 21/225*     (2006.01)
    *H01L 21/321*     (2006.01)

(56) References Cited

U.S. PATENT DOCUMENTS

| | | | | |
|---|---|---|---|---|
| 7,217,669 | B2* | 5/2007 | Choi | H01L 21/02356 |
| | | | | 438/785 |
| 9,431,285 | B2* | 8/2016 | Tamura | H01L 21/02046 |
| 2002/0115306 | A1* | 8/2002 | Won | C23C 16/405 |
| | | | | 438/779 |
| 2003/0049943 | A1* | 3/2003 | Choi | H01L 21/02356 |
| | | | | 438/785 |
| 2003/0166346 | A1* | 9/2003 | Park | C23C 16/56 |
| | | | | 438/785 |
| 2010/0216306 | A1* | 8/2010 | Yoshimi | C23C 16/34 |
| | | | | 257/E21.17 |

* cited by examiner

SUBSTRATE PROCESSING METHOD

CROSS-REFERENCE TO RELATED APPLICATIONS

This U.S. non-provisional patent application claims priority under 35 U.S.C. § 119 of Korean Patent Application No. 10-2021-0043412, filed on Apr. 2, 2021, the entire contents of which are hereby incorporated by reference.

FIELD OF THE INVENTION

The present invention relates to a substrate processing method, and more particularly, to a substrate processing method capable of preventing deterioration of thin film properties according to temperature regulation in the inside of a chamber during substrate processing.

BACKGROUND ART

Elements such as semiconductors, LCD substrates, and OLED substrates are manufactured through semiconductor processes including one or more deposition processes and etching processes.

In particular, the semiconductor element has a thin film which is formed, by a deposition process, on the substrate surface so as to form circuit patterns and the like, and this formation may be performed by various semiconductor processes such as CVD, PVD, and ALD.

Meanwhile, according to the related art, an annealing process has been performed to remove impurities from a thin film formed on a substrate through a deposition process. During this process, pressure and temperature inside a chamber are changed to move the impurities present inside of the thin film to the surface of the thin film or the outside of the thin film.

However, while the annealing process is performed, when the temperature inside the chamber is raised in a state in which $O_2$ remains on a substrate when the substrate is input, or when leakage inside the chamber occurs or $O_2$ is outgassed from a chamber wall or the inside of the substrate in a state in which the temperature inside the chamber is high and the pressure is lower than the atmospheric pressure, the $O_2$ reacts with a thin film to be annealed, and thin film properties (e.g., Rs) deteriorate.

SUMMARY OF THE INVENTION

To solve the above mentioned limitations, the purpose of the present invention is to provide a substrate processing method capable of preventing deterioration of thin film properties according to temperature regulation in the inside of a chamber.

In accordance with an embodiment of the present invention, a substrate processing method includes: a pressurizing operation of raising a process pressure from a first pressure ($P_1$) to a second pressure ($P_2$) that is greater than the atmospheric pressure; a depressurizing operation of lowering the process pressure from a sixth pressure ($P_6$), which is greater than the atmospheric pressure, to a seventh pressure ($P_7$); arid an annealing operation of changing the process pressure into a preset pressure change pattern, between the pressurizing operation and the depressurizing operation, under a temperature atmosphere of a second temperature ($T_2$) higher than the room temperature, wherein a temperature raising operation of raising a temperature atmosphere from a first temperature ($T_1$) to the second temperature ($T_2$) is performed from a preset temperature raising start point ($t_1$) to a preset temperature raising end point ($t_2$) while the pressurizing operation is performed or after the pressurizing operation is performed.

The temperature raising start point ($t_1$) and the temperature raising end point ($t_2$) may be set between a starting point of the pressurizing operation and a starting point of the annealing operation.

The temperature raising start point ($t_1$) may be set to a point of time after the process pressure is pressurized to the atmospheric pressure or more.

The temperature raising operation may be performed for a preset temperature raising time, after the pressurizing operation is performed and before the annealing operation is performed, in a state in which the process pressure is maintained at the second pressure ($P_2$).

The substrate processing method may further include a vacuum operation which is provided before the pressurizing operation is performed and in which the process pressure is in a vacuum state.

In the substrate processing method, a temperature lowering operation of lowering a temperature atmosphere from the second temperature ($T_2$) to a third temperature ($T_3$) may be performed from a preset temperature lowering start point ($t_3$) to a temperature lowering end point ($t_4$), after the annealing operation is performed, before the depressurizing operation is performed or while the depressurizing operation is performed.

The temperature lowering start point ($t_3$) and the temperature lowering end point ($t_4$) may be set between an ending point of the annealing operation and an ending point of the depressurizing operation.

The temperature lowering end point ($t_4$) may be set to a point of time before the process pressure is depressurized to the atmospheric pressure or less.

The depressurizing operation may include: a first depressurizing operation of lowering the process pressure from the sixth pressure ($P_6$), which is greater than the atmospheric pressure, to an eighth pressure ($P_8$); a pressure maintaining operation of maintaining the process pressure at the eighth pressure ($P_8$); and a second depressurizing operation of lowering the process pressure from the eighth pressure ($P_8$) to the seventh pressure ($P_7$), wherein the temperature lowering start point ($t_3$) and the temperature lowering end point ($t_4$) are set between an ending point of the annealing operation and an ending point of the first depressurizing operation.

The temperature lowering operation may be performed for a preset temperature to lowering time, after the annealing operation is finished and before the depressurizing operation is performed, in a state in which the sixth pressure ($P_6$) is maintained.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE PREFERRED EMBODIMENTS

Hereinafter, a substrate processing method according to the present invention will be described with reference to the accompanying drawings.

Terms used in this specification and claims should not be restrictively to interpreted as ordinary meanings or dictionary-based meanings, but should be interpreted as meanings and concepts conforming to technical aspects of the present invention.

The embodiments described in this specification and the configurations illustrated in the drawings are only preferred embodiments of the present invention, and do not represent all of the technical spirit of the invention. Accordingly, there may be various equivalents and modification examples that may replace them at the filing date of the present application.

Disclosed is a substrate processing method including: a pressurizing operation of raising a process pressure from a first pressure $P_1$ to a second pressure $P_2$ that is greater than the atmospheric pressure; a depressurizing operation of lowering the process pressure from a sixth pressure $P_6$, which is greater than the atmospheric pressure, to a seventh pressure $P_7$; and an annealing operation of changing the process pressure into a preset pressure change pattern between the pressurizing operation and the depressurizing operation, under a temperature atmosphere of a second temperature $T_2$ higher than the room temperature. A temperature raising operation of raising a temperature atmosphere from a first temperature $T_1$ to the second temperature $T_2$ is performed from a preset temperature raising start point $t_1$ to a preset temperature raising end point $t_2$ while the pressurizing operation is performed or after the pressurizing operation is performed.

Here, the chamber is configured to form a closed processing space, and various configurations are possible.

For example, the chamber may have a batch-type structure, and may have a dual pipe structure including an inner chamber and an outer chamber.

The pressurizing operation, the depressurizing operation, and the annealing operation are operations of changing process pressure inside the chamber. The process to pressure may be changed by various times and pressures.

Here, at least one operation of the pressurizing operation, the depressurizing operation, and the annealing operation may change the process pressure by supplying and/or exhausting a variable pressure gas that includes one or more elements of hydrogen (H), oxygen (O), nitrogen (N), chlorine (Cl), fluorine(F), and the like.

The pressurizing operation is an operation of raising the process pressure from the first pressure $P_1$ to the second pressure $P$ that is greater than the atmospheric pressure, and various configurations are possible.

The pressurizing operation may be performed at various pressurizing speeds, various pressurizing times, and the like.

Here, the first pressure $P_1$ may be set to various pressure values, and for example, may be a pressure in a vacuum state lower than the atmospheric pressure.

Here, the second pressure $P_2$ may be set to various pressure values, and for example, may have a pressure value of about 2 atm higher than the atmospheric pressure.

Also, a vacuum operation, in which the process pressure is in a vacuum state, may be further included before the pressurizing operation is performed.

The vacuum operation is an operation in which the process pressure is in the vacuum state, and various configurations are possible.

For example, the vacuum operation may be performed at various times.

Also, the first pressure $P_1$, which is the process pressure in the vacuum operation, may be a pressure in the vacuum state.

Also, it is apparent that before/after the vacuum operation, an operation of lowering the process pressure from the pressure higher than the vacuum to the first pressure $P_1$ of the vacuum state or an operation of raising the process pressure from the to first pressure $P_1$ of the vacuum state to the pressure higher than the vacuum may be further included.

The depressurizing operation is an operation of lowering the process pressure from a sixth pressure $P_6$, which is greater than the atmospheric pressure, to a seventh pressure $P_7$, and various configurations are possible.

The depressurizing operation may be performed at various depressurizing speeds, various depressurizing times, and the like.

For example, the depressurizing operation may include: a first depressurizing operation of lowering the process pressure from the sixth pressure $P_6$, which is greater than the atmospheric pressure, to an eighth pressure $P_8$; a pressure maintaining operation of maintaining the process pressure at the eighth pressure $P_8$; and a second depressurizing operation of lowering the eighth pressure $P_8$ to the seventh pressure $P_7$.

Here, the sixth pressure $P_6$ may be set to various pressure values, and for example, may have a pressure value of about 2 atm higher than the atmospheric pressure.

Here, the eighth pressure $P_8$ may have any pressure value between the sixth pressure $P_6$ and the seventh pressure $P_7$, and for example, may be a pressure in the atmospheric pressure state.

Here, the seventh pressure $P_7$ may be set to various pressure values, and for example, may be the atmospheric pressure or less or a pressure in the vacuum state.

The first depressurizing operation is an operation of lowering the process pressure from the sixth pressure $P_6$, which is greater than the atmospheric pressure, to the eighth pressure $P_8$, and various configurations are possible.

For example, the first depressurizing operation may have various depressurizing speeds and depressurizing times.

Here, the pressure maintaining operation is an operation of maintaining the process pressure at the eighth pressure $P_8$, and various configurations are possible.

For example, the pressure maintaining operation may have various pressure maintaining times.

Here, the second depressurizing operation is an operation of lowering the process pressure from the eighth pressure $P_8$ to the seventh pressure $P_7$, and various configurations are possible.

For example, the second depressurizing operation may have various depressurizing speeds and depressurizing times.

Meanwhile, the annealing operation is performed between the pressurizing operation and the depressurizing operation, and the process pressure is changed into a preset pressure change pattern under a temperature atmosphere of the second temperature $T_2$ higher than the room temperature, and various configurations are possible.

Specifically, in the annealing operation, when the process pressure is pressurized under an atmosphere of a variable pressure gas as the variable pressure gas is injected into the chamber, impurities (e.g., Cl) separated, in a loosely coupled state, from elements (e.g., Ti) constituting the thin film and impurities (e.g., Cl) in a free and uncoupled state are coupled to elements e.g., H) included in the variable pressure gas and changed into a deactivated state (e.g., HCL) in which vaporization easily occurs. Also, impurities in a firmly coupled state with the elements constituting the thin film may be highly likely to be reduced as the bonds thereof are broken. Here, when the process pressure is rapidly depressurized from a pressurized state, the impurities may be discharged with the variable pressure gas in the deactivated state.

Here, various gases may be used as the variable pressure gas, and for example, $H_2$ gas may be used together with a carrier gas such as $N_2$.

The process pressure may be pressurized and depressurized during injecting and discharging the variable pressure gas, here, the process pressure may be changed into a preset pressure change pattern according to removal degrees of impurities, improvement direction for thin film properties (e.g., compositions, particle sizes, Rs, etc.), or the like.

Here, the preset pressure change pattern may be formed by raising, lowering, and maintaining the process pressure, and may have various pressure change patterns.

For example, as illustrated in FIGS. 1 to 4, the pressure change pattern may include at least one of a lowering pattern of lowering the process pressure from the second pressure $P_2$ or a fifth pressure $P_5$, which is higher than the atmospheric pressure, to a fourth pressure $P_4$, which is lower than the atmospheric pressure, a raising pattern that rises from the fourth pressure $P_4$ to the fifth pressure $P_5$ or a sixth pressure $P_6$, which is higher than the atmospheric pressure, and a pressure maintaining pattern that is maintained at the second pressure $P_2$, the fifth pressure $P_5$, and the third pressure $P_3$.

Here, it is apparent that the pressure change pattern may not be limited to the lowering pattern, the raising pattern, and the maintaining patter described above and have various pressure change patterns, and each of the patterns may be repeatedly performed at least N times or more (N≥1).

Here, the second pressure $P_2$ may be set to various pressure values as described above, and for example, may have a pressure value of about 2 atm higher than the atmospheric pressure.

Here, the third pressure $P_3$ may have any pressure value between the second pressure $P_2$ and the fourth pressure $P_4$, and for example, may be a pressure in the atmospheric pressure state.

Here, the fourth pressure $P_4$ may be set to various pressure values, and for example, may have a pressure value lower than the atmospheric pressure.

Here, the fifth pressure $P_5$ may be set to various pressure values, and for example, may have a pressure value of about 2 atm higher than the atmospheric pressure.

Here, the sixth pressure $P_6$ may be set to various pressure values, and for example, may have a pressure value of about 2 atm higher than the atmospheric pressure.

Meanwhile, the annealing operation is performed under the temperature atmosphere of the second temperature $T_2$ higher than the room temperature so as to remove impurities remaining in the thin film and enhance improvement efficiency of the thin film properties in the substrate processing process that includes the annealing operation, a temperature raising operation of raising the temperature inside the chamber to the second temperature $T_2$ when the process is performed and a temperature lowering operation of lowering the temperature to the third temperature $T_3$ when the process is finished are essentially performed.

Here, the temperature raising operation may be understood as an operation of raising the temperature atmosphere from the first temperature $T_1$ to the second temperature $T_2$ from the temperature raising start point $t_1$ to the temperature raising end point $t_2$.

Here, the temperature lowering operation may be understood as an operation of lowering the temperature atmosphere from the second temperature $T_2$ to the third temperature $T_3$ from the temperature lowering start point $t_3$ to the temperature lowering end point $t_4$.

Here, the temperature raising start point $t_1$ may be understood as a point of time when the temperature raising operation starts as the temperature inside the chamber is raised from the first temperature $T_1$, and the temperature raising end point $t_2$ may be understood as a point of time when the temperature raising operation is finished as the temperature inside the chamber reaches the second temperature $T_2$.

Here, the temperature lowering start point $t_3$ may be understood as a point of time when the temperature lowering operation starts as the temperature inside the chamber is lowered from the second temperature $T_2$, and the temperature lowering end point $t_4$ may be understood as a point of time when the temperature lowering operation is finished as the temperature inside the chamber reaches the third temperature $T_3$.

Here, the first temperature $T_1$ may have various temperature values, and for example, may be about 200° C.

Here, the second temperature $T_2$ may have various temperature values, and for example, may have a temperature value between about 400° C. and about 500° C.

Here, the third temperature $T_3$ may have various temperature values, and for example, may be about 200° C.

However, according to the related art, when the temperature inside the chamber is raised in a state in which $O_2$ remains on a substrate when the substrate is input, or when leakage inside the chamber occurs or $O_2$ is outgassed from a chamber wall or the inside of the substrate in a state in which the temperature inside the chamber is high and the pressure is lower than the atmospheric pressure, the $O_2$ reacts with the thin film to be annealed.

Figure 1:
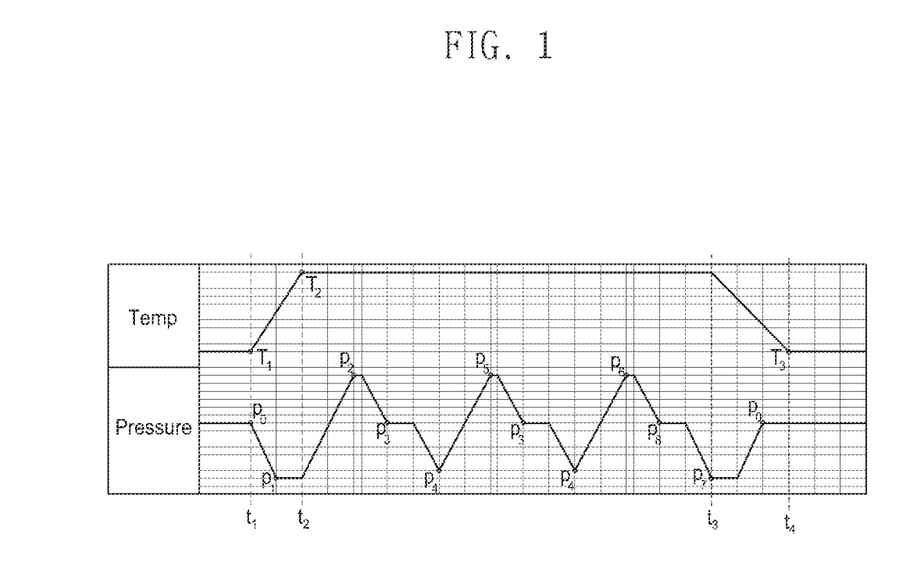
FIG. 1 is a graph showing changes in pressure and temperature when a substrate processing method according to the related art is performed.

Specifically, as illustrated in FIG. 1 according to the related art, the temperature raising start point $t_1$ and the temperature raising end point $t_2$ are set before the pressurizing operation is performed, and the temperature lowering start point $t_3$ and the temperature lowering end point $t_4$ are set after the depressurizing operation is performed. Thus, the temperature raising operation and the temperature lowering operation are performed in a state in which the process pressure is lower than the atmospheric pressure. Accordingly, $O_2$ present in the chamber reacts with the thin film formed on the substrate, and the thin film properties (e.g., Rs) deteriorate.

Thus, the inventors of the present invention have recognized these limitations and invented a substrate processing process to solve these limitations, which prevents deterioration of thin film properties by specifying the temperature raising start point $t_1$, the temperature raising end point $t_2$, the temperature lowering start point $t_3$, and the temperature lowering end point $t_4$ to points of time capable of minimizing deterioration of the thin film properties. This will be described below in detail.

First, the temperature raising operation of the present invention is an operation of raising the temperature atmosphere from the first temperature $T_1$ to the second temperature $T_2$, from the preset temperature raising start point $t_1$ to the temperature raising end point $t_2$, while the pressurizing operation is performed or after the pressurizing operation is performed. Various configurations thereof are possible.

Figure 2:
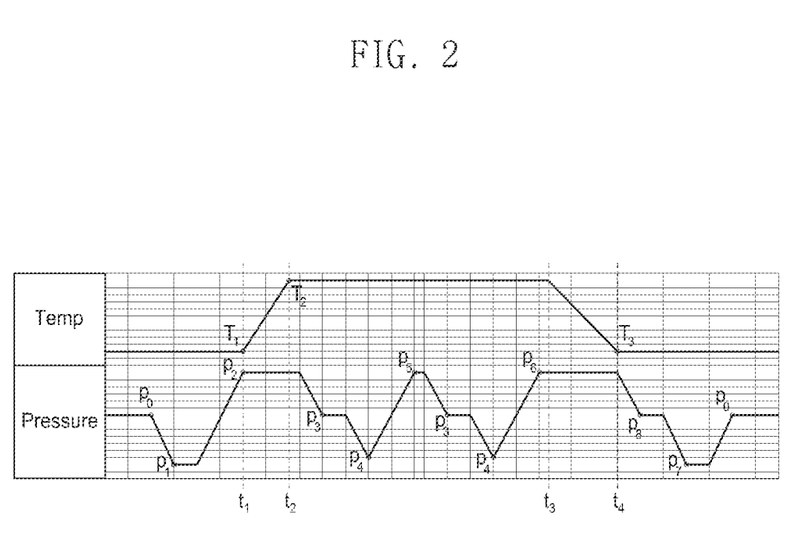
FIG. 2 is a graph showing changes in pressure and temperature when a substrate processing method according to the present invention is performed.
Figure 3:
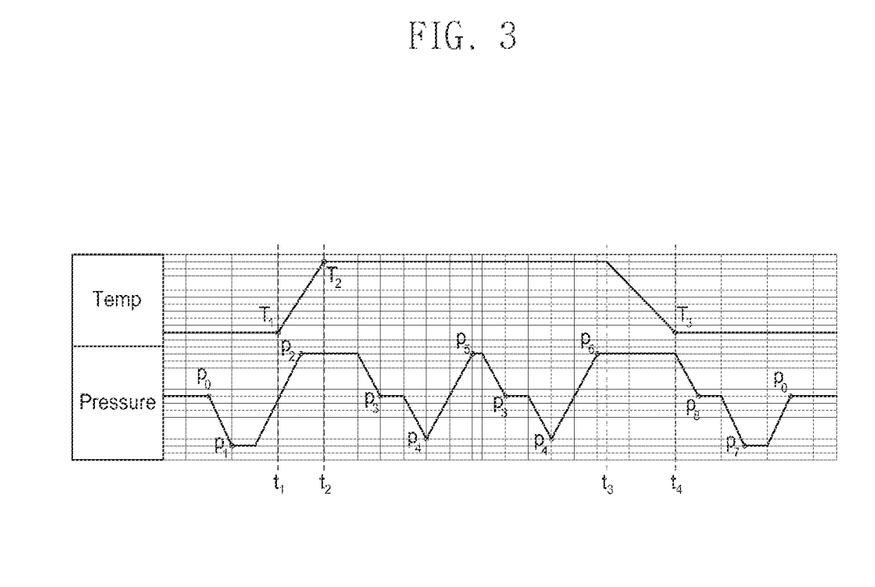
FIG. 3 is a graph showing changes in pressure and temperature when another embodiment of the substrate processing method of FIG. 2 is performed.
Figure 4:
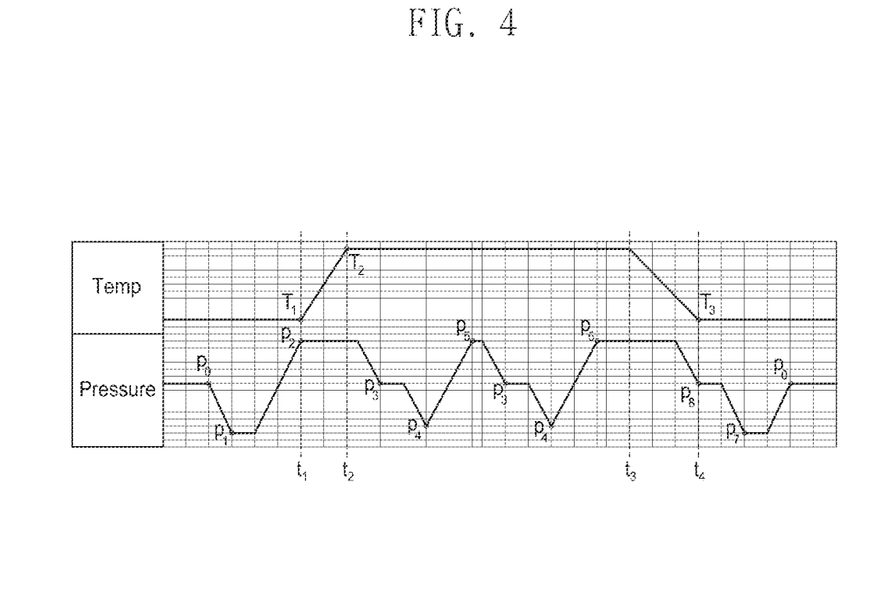
FIG. 4 is a graph showing changes in pressure and temperature when still another embodiment of the substrate processing method of FIG. 2 is performed.

Here, as illustrated in FIGS. 2 to 4, the temperature raising start point $t_1$ and the temperature raising end point $t_2$ in the temperature raising operation may be set between a starting point of the pressurizing operation (a point of time at which pressurizing from the first pressure $P_1$ to the second pressure $P_2$ starts) and a starting point of the annealing operation (a point of time at which depressurizing from the second pressure $P_2$ to the fourth pressure $P_4$ starts).

As one example, as illustrated in FIG. 3, the temperature raising operation of the present invention may be performed by raising the temperature atmosphere from the first temperature $T_1$ to the second temperature $T_2$, from the preset temperature raising start point $t_1$ to the temperature raising end point $t_2$, 'while the pressurizing operation is performed'.

Here, the temperature raising start point $t_1$ may be set to any point of time after the starting point of the pressurizing operation, but preferably, may be set to a point of time after a process pressure is pressurized to the atmospheric pressure or higher by inputting a certain amount of the variable pressure gas so that the relevant thin film can be sufficiently protected from the $O_2$ gas.

Here, the substrate processing method of the present invention further includes the vacuum operation which is provided before the pressurizing operation is performed and in which the process pressure is in a vacuum state. Thus, $O_2$ remaining inside the chamber is discharged to the outside in the vacuum operation, and the $O_2$ itself to react with the thin film formed on the substrate is hardly present inside the chamber. Accordingly, deterioration of the thin film may be prevented.

That is, the temperature raising operation of the present invention may be performed for a preset temperature raising time, after the vacuum operation described above is performed and before the annealing operation is performed, in a state in which the process pressure is raised to the second pressure $P_2$ and/or maintained at the second pressure $P_2$. As illustrated in FIG. 3, the temperature raising start point $t_1$ and the temperature raising end point $t_2$ may be set, while the pressurizing operation is performed and before the annealing operation is performed, in a state in which the process pressure is raised to and maintained at the second pressure $P_2$.

As another example, as illustrated in FIGS. 2 and 4, the temperature raising operation of the present invention may be performed by raising the temperature atmosphere from the first temperature $T_1$ to the second temperature $T_2$, from the preset temperature raising start point $t_1$ to the temperature raising end point $t_2$, 'after the pressurizing operation is performed'.

Here, the temperature raising operation of the present invention may be performed for a preset temperature raising time, after the pressurizing operation is performed and before the annealing operation is performed, in a state in which the second pressure $P_2$ is maintained.

That is, as illustrated in FIGS. 2 and 4, the temperature raising start point $t_1$ and the temperature raising end point $t_2$ according to the temperature raising operation may be set, after the pressurizing operation is performed and before the annealing operation is performed, in a state in which the process pressure is maintained at the second pressure $P_2$.

In this case, even if remaining $O_2$ is present inside the chamber, a relatively low temperature (the first temperature $T_1$) state is maintained because it is before the temperature is raised, thus it is difficult for $O_2$ to react with the thin film formed on the substrate. After the temperature is raised, $O_2$ is prevented from entering from the outside through a leak of the chamber because the process pressure is maintained at the second pressure $P_2$ higher than the atmospheric pressure. Even if $O_2$ remains in the chamber due to outgassing, the thin film formed on the substrate may be protected because the variable pressure gas (e.g., $H_2$) is sufficiently supplied, thereby preventing deterioration of the thin film.

Also, the temperature raising time described above may be defined as a time from the temperature raising start point $t_1$ to the temperature raising end point $t_2$, and may be diversely set according to devices, thin films, process characteristics, or the like.

Meanwhile, the temperature lowering operation of the present invention is an operation of lowering the temperature atmosphere from the second temperature $T_2$ to the third temperature $T_3$, from the preset temperature lowering start point $t_3$ to the temperature lowering end point $t_4$, after the annealing operation is performed, before the depressurizing operation is performed or while the depressurizing operation is performed. Various configurations thereof are possible.

Here, as illustrated in FIGS. 2 to 4, the temperature lowering start point $t_3$ and the temperature lowering end point $t_4$ in the temperature lowering operation may be set between an ending point of the annealing operation (a point of time at which pressurizing from the fourth pressure $P_4$ to the sixth pressure $P_6$ is finished) and an ending point of the depressurizing operation (a point of time at which depressurizing from the sixth pressure $P_6$ to the seventh pressure $P_7$ is finished).

However, herein, the temperature lowering end point $t_4$ may be set to any point of time before the ending point of the depressurizing operation. In a case in which the process pressure is the atmospheric pressure or less, the $O_2$ gas may be input from the outside of the chamber through the chamber leak, or $O_2$ may be outgassed from a chamber wall or the inside of the substrate. Thus, the temperature lowering end point $t_4$ may be preferably set to a point of time before the process pressure is depressurized to the atmospheric pressure or less.

As one example, as illustrated in FIG. 4, the temperature lowering start point $t_3$ and the temperature lowering end point $t_4$ may be set between the point of time after the annealing operation is finished and the ending point of the first depressurizing operation (the point of time at which depressurizing from the sixth pressure $P_6$ to the eighth pressure $P_8$ is finished).

That is, the temperature lowering operation of the present invention may be performed for a preset temperature lowering time, after the annealing operation is finished and before the first depressurizing operation is finished, in a state in which the process pressure is maintained at the sixth pressure $P_6$ or depressurized to the atmospheric pressure $P_6$.

That is, the temperature lowering operation has to be finished before the first depressurizing operation is finished, that is, in a state in which the process pressure is greater than the atmospheric pressure, so as to prevent the $O_2$ from entering from the outside through the leak of the chamber.

Accordingly, the temperature lowering end point $t_4$ is preferably set before the ending point of the first depressurizing operation.

As another example, as illustrated in FIGS. 2 and 3, the temperature lowering operation of the present invention may be performed for a preset temperature lowering time, after the annealing operation is finished and before the depressurizing operation is performed, in a state in which the sixth pressure $P_6$ is maintained.

That is, as illustrated in FIGS. 2 and 3, the temperature lowering start point $t_3$ and the temperature lowering end point $t_4$ according to the temperature lowering operation may be set, after the annealing operation is finished and before the depressurizing operation is performed, in a state in which the sixth pressure $P_6$ is maintained.

In this case, even if the temperature lowering operation is performed, the process pressure is maintained at the sixth pressure $P_6$, and thus, it is difficult for the $O_2$ from entering from the outside through the leak formed in the chamber. Also, the thin film formed on the substrate is protected by the variable pressure gas described above even if outgassing is present, thereby preventing deterioration of the thin film.

Meanwhile, as described above, the temperature raising start point $t_1$, the temperature raising end point $t_2$, the temperature lowering start point $t_3$, and the temperature lowering end point $t_4$ are specified to points of time capable of minimizing deterioration of the thin film, thereby preventing deterioration of material properties of the thin film. This is confirmed though graphs of sheet resistance Rs of FIGS. 5A to 5C.

Figure 5A:
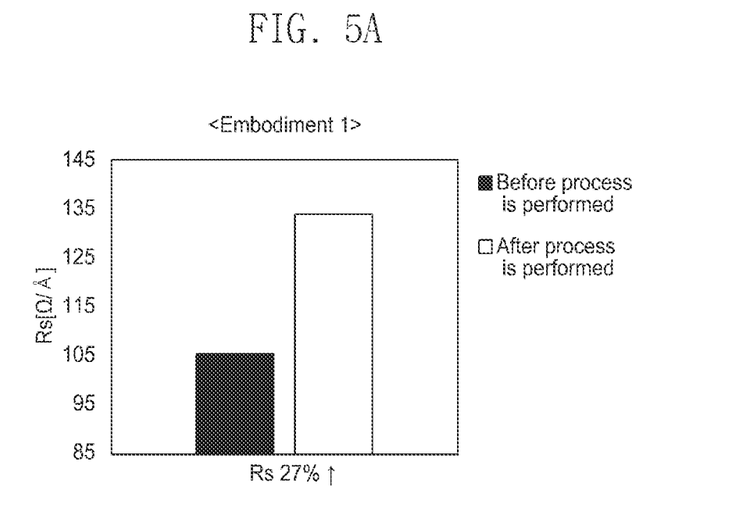
FIGS. 5A to 5C are graphs showing changes in Rs before and after annealing operations are performed on thin films manufactured by substrate processing methods according to the related art and the present invention.
Figure 5B:
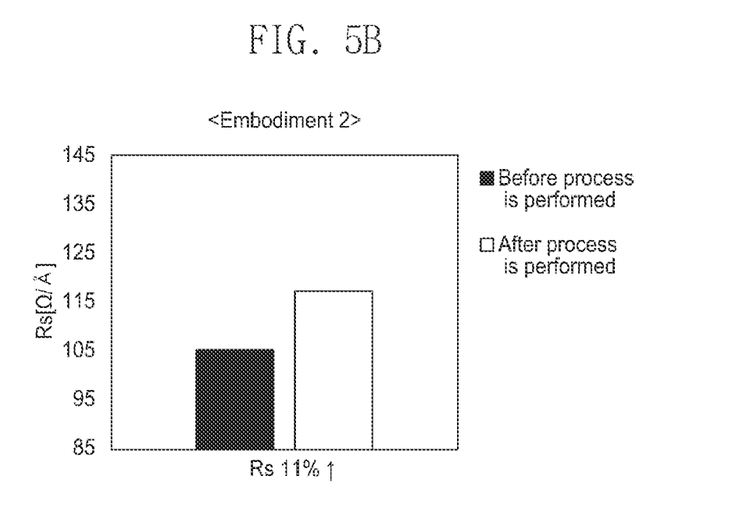
Figure 5C:
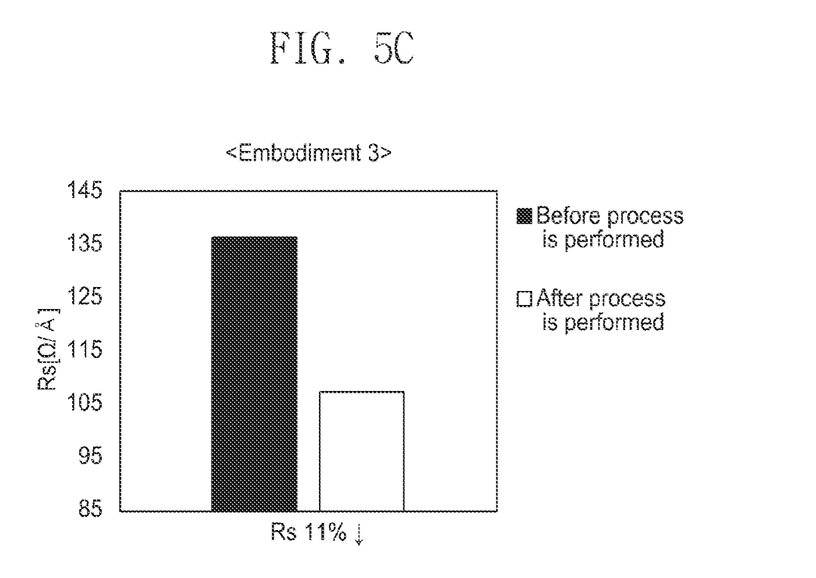

Here, the graphs of FIGS. 5A to 5C show changes in Rs of a thin film (TiN) before and after processes are performed in the substrate processing process in which the annealing operation including the temperature raising operation and the temperature lowering operation is performed.

Here, the graph of FIG. 5A shows a change in Rs of the thin film according to the substrate processing method of the related art (Embodiment 1).

Here, FIG. 5B is a graph showing a change in Rs of the thin film according to the substrate processing process in which the temperature lowering start point $t_3$ and the temperature lowering end point $t_4$ are set, after the annealing operation is finished and before the depressurizing operation is performed, in a state in which the sixth pressure $F_6$ is maintained (Embodiment 2).

Here, FIG. 5C is a graph showing a change in Rs of the thin film according to the substrate processing process in which the temperature raising start point $t_1$ and the temperature raising end point $t_2$ are set, after the pressurizing operation is performed and before the annealing operation is performed, in a state in which the process pressure is maintained at the second pressure $P_2$, and the temperature lowering start point $t_1$ and the temperature lowering end point $t_4$ are set, after the annealing operation is finished and before the depressurizing operation is performed, in a state in which the sixth pressure $P_6$ is maintained (Embodiment 3).

Regarding the thin film of Embodiment 1, it is confirmed that thin film properties deteriorate as the Rs value of the thin film increases by about 27% from about 105.63 $\Omega$/sq to about 134.20 $\Omega$/sq after the process is performed. On the other hand, regarding the thin film of Embodiment 2, it is confirmed that the Rs value of the thin film increases by about 11% from about 105.29 $\Omega$/sq to about 117.09 $\Omega$/sq after the process is performed, and an increase rate is reduced by about 16% compared to the thin film of Embodiment 1. Also, regarding the thin film of Embodiment 3, it is confirmed that thin film properties are improved as the Rs value of the thin film decreases by about 11% from about 106.49 $\Omega$/sq to about 94.38 $\Omega$/sq after the process is performed.

That is, a degree of deterioration of Rs properties of the thin film becomes lower in a case in which the temperature lowering start point $t_3$ and the temperature lowering end point $t_4$ are set to specific points of time according to the present invention, when compared to the substrate processing method of the related art. Also, in a case in which the temperature raising start point $t_1$ and the temperature raising end point $t_2$ are additionally specified according to the present invention in conjunction with specifying the temperature lowering start point $t_3$ and the temperature lowering end point $t_4$, the Rs value of the thin film becomes rather lower. Thus, the effect of the substrate processing method according to the present invention may be clearly confirmed.

Meanwhile, the substrate processing method as described above may be applied to improve properties of any thin film, but may more effectively improve the Rs properties in thin films such as TiN, Si, and the like which are thin films vulnerable to oxidation.

Also, the $O_2$ gas described in the specification is exemplarily described as a gas that reacts with the thin film, and any gas remaining inside the chamber and reacting with the thin film is possible and is not limited to the $O_2$ gas described above.

In the substrate processing method according to the present invention, the temperature raising operation of raising the temperature atmosphere from the first temperature $T_1$ to the second temperature $T_2$ from the preset temperature raising start point $t_1$ to the preset temperature raising end point $t_2$ is performed while the pressurizing operation is performed or after the pressurizing operation is performed. Thus, the thin film properties (e.g., Rs) formed on the substrate may be improved.

Also, in the substrate processing method according to the present invention, the temperature lowering operation of lowering the temperature atmosphere from the second temperature $T_2$ to the third temperature $T_3$ from the preset temperature lowering start point $t_3$ to the temperature lowering end point $t_4$ is performed after the annealing operation is performed. Thus, the thin film properties (e.g., Rs) formed on the substrate may be improved.

Also, in the substrate processing method according to the present invention, the vacuum operation is further performed before the pressurizing operation, thereby preventing a gas (e.g., $O_2$) remaining inside the chamber from reacting with the thin film by discharging the gas. Thus, the thin film properties (e.g., Rs) formed on the substrate may be more effectively improved.

The above is merely described with respect to some preferred embodiments that may be implemented according to the present invention. Thus, as is well known, the scope of the present invention should not be construed as being limited by the above embodiments, and the technical ideas of the present invention described above and technical concepts on the basis of these technical ideas are considered to be included in the scope of the present invention.

What is claimed is:

1. A substrate processing method comprising:
a pressurizing operation of raising a process pressure from a first pressure ($P_1$) to a second pressure ($P_2$) that is greater than the atmospheric pressure;

a depressurizing operation of lowering the process pressure from a sixth pressure ($P_6$), which is greater than the atmospheric pressure, to a seventh pressure ($P_7$); and an annealing operation of changing the process pressure into a preset pressure change pattern, between the pressurizing operation and the depressurizing operation, under a temperature atmosphere of a second temperature ($T_2$) higher than the room temperature, wherein a temperature raising operation of raising a temperature atmosphere from a first temperature ($T_1$) to the second temperature ($T_2$) is performed from a preset temperature raising start point ($t_1$) to a preset temperature raising end point ($t_2$) while the pressurizing operation is performed or after the pressurizing operation is performed.

2. The substrate processing method of claim 1, wherein the temperature raising start point ($t_1$) and the temperature raising end point ($t_2$) are set between a starting point of the pressurizing operation and a starting point of the annealing operation.

3. The substrate processing method of claim 2, wherein the temperature raising start point ($t_1$) is set to a point of time after the process pressure is pressurized to the atmospheric pressure or more.

4. The substrate processing method of claim 2, wherein the temperature raising operation is performed for a preset temperature raising time, after the pressurizing operation is performed and before the annealing operation is performed, in a state in which the process pressure is maintained at the second pressure ($P_2$).

5. The substrate processing method of claim 2, further comprising a vacuum operation which is provided before the pressurizing operation is performed and in which the process pressure is in a vacuum state.

6. The substrate processing method of claim 1, wherein a temperature lowering operation of lowering a temperature atmosphere from the second temperature ($T_2$) to a third temperature ($T_3$) is performed from a preset temperature lowering start point ($t_3$) to a temperature lowering end point ($t_4$), after the annealing operation is performed, before the depressurizing operation is performed or while the depressurizing operation is performed.

7. The substrate processing method of claim 6, wherein the temperature lowering start point ($t_3$) and the temperature lowering end point ($t_4$) are set between an ending point of the annealing operation and an ending point of the depressurizing operation.

8. The substrate processing method of claim 7, wherein the temperature lowering end point ($t_4$) is set to a point of time before the process pressure is depressurized to the atmospheric pressure or less.

9. The substrate processing method of claim 6, wherein the depressurizing operation comprises:

first depressurizing operation of lowering the process pressure from the sixth pressure ($P_6$), which is greater than the atmospheric pressure, to an eighth pressure ($P_8$);

a pressure maintaining operation of maintaining the process pressure at the eighth pressure ($P_8$); and a second depressurizing operation of lowering the process pressure from the eighth pressure ($P_8$) to the seventh pressure ($P_7$), wherein the temperature lowering start point ($t_3$) and the temperature lowering end point ($t_4$) are set between an ending point of the annealing operation and an ending point of the first depressurizing operation.

10. The substrate processing method of claim 6, wherein the temperature lowering operation is performed for a preset temperature lowering time, after the annealing operation is finished and before the depressurizing operation is performed, in a state in which the sixth pressure ($P_6$) is maintained.

11. A substrate processing method comprising:

a pressurizing operation of raising a process pressure from a first pressure ($P_1$) to a second pressure ($P_2$) that is greater than the atmospheric pressure;

a depressurizing operation of lowering the process pressure from a sixth pressure ($P_6$), which is greater than the atmospheric pressure, to a seventh pressure ($P_7$); and an annealing operation of changing the process pressure into a preset pressure change pattern, between the pressurizing operation and the depressurizing operation, under a temperature atmosphere of a second temperature ($T_2$) higher than the room temperature, wherein a temperature lowering operation of lowering a temperature atmosphere from the second temperature ($T_2$) to a third temperature ($T_3$) is performed from a preset temperature lowering start point ($t_3$) to a temperature lowering end point ($t_4$), after the annealing operation is performed, before the depressurizing operation is performed or while the depressurizing operation is performed.

12. The substrate processing method of claim 11, wherein the temperature lowering start point ($t_3$) and the temperature lowering end point ($t_4$) are set between an ending point of the annealing operation and an ending point of the depressurizing operation.

13. The substrate processing method of claim 12, wherein the temperature lowering end point ($t_4$) is set to a point of time before the process pressure is depressurized to the atmospheric pressure or less.

14. The substrate processing method of claim 11, wherein the depressurizing operation comprises:

a first depressurizing operation of lowering the process pressure from the sixth pressure ($P_6$), which is greater than the atmospheric pressure, to an eighth pressure ($P_8$);

a pressure maintaining operation of maintaining the process pressure at the eighth pressure ($P_8$); and a second depressurizing operation of lowering the process pressure from the eighth pressure ($P_8$) to the seventh pressure ($P_7$), wherein the temperature lowering start point ($t_3$) and the temperature lowering end point ($t_4$) are set between an ending point of the annealing operation and an ending point of the first depressurizing operation.

15. The substrate processing method of claim 11, wherein the temperature lowering operation is performed for a prose temperature lowering time, after the annealing operation is finished and before the depressurizing operation is performed, in a state in which the sixth pressure ($P_6$) is maintained.

* * * * *